United States Patent
Usov et al.

(10) Patent No.: US 7,589,004 B2
(45) Date of Patent: Sep. 15, 2009

(54) METHOD FOR IMPLANTATION OF HIGH DOPANT CONCENTRATIONS IN WIDE BAND GAP MATERIALS

(75) Inventors: Igor Usov, Los Alamos, NM (US); Paul N. Arendt, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 620 days.

(21) Appl. No.: 11/438,887

(22) Filed: May 23, 2006

(65) Prior Publication Data

US 2006/0286784 A1    Dec. 21, 2006

Related U.S. Application Data

(60) Provisional application No. 60/692,901, filed on Jun. 21, 2005.

(51) Int. Cl.
*H01L 21/04* (2006.01)
(52) U.S. Cl. .............. 438/510; 438/663; 257/E21.085; 257/E21.126; 257/E21.32; 257/E21.217; 257/E21.324
(58) Field of Classification Search ........... 438/222, 438/311, 341, 363, 506, 508, 509, 510, 606, 438/663, 933
See application file for complete search history.

(56) References Cited

U.S. PATENT DOCUMENTS

| | | | | |
|---|---|---|---|---|
| 4,920,396 A | * | 4/1990 | Shinohara et al. | 257/376 |
| 5,641,975 A | * | 6/1997 | Agarwal et al. | 257/76 |
| 5,877,515 A | * | 3/1999 | Ajit | 257/76 |
| 6,734,461 B1 | * | 5/2004 | Shiomi et al. | 257/77 |

* cited by examiner

*Primary Examiner*—David Nhu
(74) *Attorney, Agent, or Firm*—Robert P. Santandrea; Meredith H. Schoenfeld

(57) ABSTRACT

A method that combines alternate low/medium ion dose implantation with rapid thermal annealing at relatively low temperatures. At least one dopant is implanted in one of a single crystal and an epitaxial film of the wide band gap compound by a plurality of implantation cycles. The number of implantation cycles is sufficient to implant a predetermined concentration of the dopant in one of the single crystal and the epitaxial film. Each of the implantation cycles includes the steps of: implanting a portion of the predetermined concentration of the one dopant in one of the single crystal and the epitaxial film; annealing one of the single crystal and the epitaxial film and implanted portion at a predetermined temperature for a predetermined time to repair damage to one of the single crystal and the epitaxial film caused by implantation and activates the implanted dopant; and cooling the annealed single crystal and implanted portion to a temperature of less than about 100° C. This combination produces high concentrations of dopants, while minimizing the defect concentration.

35 Claims, 5 Drawing Sheets

S210 — Implant portion of dopant in single crystal or epitaxial film

S220 — Anneal single crystal or epitaxial film and implanted portion

S230 — Cool single crystal or epitaxial film and implanted portion to ≤ 100°C

METHOD FOR IMPLANTATION OF HIGH DOPANT CONCENTRATIONS IN WIDE BAND GAP MATERIALS

REFERENCE TO PRIOR APPLICATION

This application claims the benefit of U.S. Provisional Application No. 60/692,901, filed Jun. 21, 2005.

STATEMENT REGARDING FEDERAL RIGHTS

This invention was made with government support under Contract No. W-7405-ENG-36, awarded by the U.S. Department of Energy. The government has certain rights in the invention.

BACKGROUND OF INVENTION

The invention relates to a method of implanting dopants in a wide band gap material. More particularly, the invention relates to implanting dopants in such materials and repairing damage caused by implantation.

Wide band gap materials, such as gallium nitride (GaN), are well-suited for applications in various optoelectronic devices, including light emitting diodes, lasers, and ultraviolet radiation detectors, as well as for electronic devices operating at high temperatures, high frequencies, and high power levels. The viability of any optoelectronic or electronic device technology based on such materials depends on developing controlled doping techniques either during growth, or subsequently using diffusion or ion implantation. The incorporation of dopants by diffusion into many of these materials is very difficult, due to low diffusion coefficients of dopant elements. In addition, lateral doping during film growth is impossible for microcircuits. Thus, ion implantation is the only planar-selective area doping technique that is presently available for many wide band gap materials.

The main obstacle to achieving high quality implanted layers in many wide band gap materials is poor recovery of the radiation damage introduced during high dose ion implantation. This problem is of particular concern for doping these materials with acceptors and optically active dopants. The difficulty in p-type doping such materials by ion implantation is related to three major reasons. First, the high electron background concentration, caused by n-type impurities and native defects formed during growth of the wide band gap material, has to be overcompensated. Second, relatively deep acceptor levels result in only a small fraction of acceptors being ionized at room temperature. Third, implantation-induced defects may compensate the acceptors and getter the implanted elements, thereby rendering them electrically inactive. The difficulty in doping with optically active dopants is primarily related to native and implantation-induced defects, which provide non-radiative recombination channels.

Among the factors listed above, defects play a major role. N-type impurities and native defects can be removed by improving growth conditions of the wide band gap material. In the case of implantation-induced defects, an appropriate annealing procedure has to be employed. However, beginning with certain ion dose levels at which secondary defects such as dislocations, damage clusters, and amorphous zones start to form, radiation damage in such wide band gap materials is extremely stable against thermal annealing. To remove this damage, very high annealing temperatures (>1300° C. for GaN) are required. To inhibit thermal decomposition of materials such as GaN, annealing at such temperatures must be conducted at extremely high nitrogen pressures (~10 kbar), or must utilize a cap layer (aluminum nitride (AlN), for example, serves as a cap for GaN). Annealing materials at such high temperature, however, create other problems. For example, hole density and luminescence intensity tend to decrease in GaN after high temperature annealing, and the AlN cap layers undergo local failure.

Other attempts to reduce the ion damage include ion implantation at elevated temperatures. In spite of observations of ion implantation damage reduction, no significant improvement in electrical properties has been reported. In addition, high temperature implantation results in other problems, such as reverse annealing, radiation enhanced diffusion, decomposition of the host material, and formation of very stable defects, the latter being more difficult to remove by annealing when compared to implantations performed at room temperature.

Repair and recovery from radiation damage incurred by implantation of dopants in wide band gap materials is currently difficult to achieve. Therefore, what is needed is a method of implanting high concentrations of such dopants while minimizing radiation damage. What is also needed is a method of repairing radiation damage caused by the implantation of such dopants.

SUMMARY OF INVENTION

The present invention meets these and other needs by providing a method that combines alternate low/medium ion dose implantation (LMDI) with rapid thermal annealing (RTA) at relatively low temperatures. This combination produces high concentrations of dopants, while minimizing the defect concentration in wide band gap materials.

Accordingly, one aspect of the invention is to provide a method of implanting a predetermined concentration of at least one dopant in a wide band gap compound. The method comprises the steps of: providing one of a single crystal and an epitaxial film of the wide band gap compound; providing at least one dopant; and implanting the predetermined concentration of the at least one dopant in one of the single crystal and the epitaxial film of the wide band gap compound by a plurality of implantation cycles. The number of implantation cycles is sufficient to implant the predetermined concentration of the at least one dopant in the one of the single crystal and the epitaxial film of the wide band gap compound. Each of the implantation cycles comprises the steps of: implanting a portion of the predetermined concentration of the at least one dopant in one of the single crystal and the epitaxial film; annealing one of the single crystal and the epitaxial film and implanted portion at a predetermined temperature for a predetermined time, wherein the annealing repairs damage to one of the single crystal and the epitaxial film caused by implanting and activates the implanted dopant; and cooling the annealed single crystal or epitaxial film and implanted portion at a predetermined cooling rate to a temperature of less than about 100° C.

Another aspect of the invention is to provide a method of repairing damage to one of a single crystal and an epitaxial film of a wide band gap material due to implantation of dopants within one of the single crystal and the epitaxial film. The method comprises the steps of: providing one of the single crystal and the epitaxial film, wherein a plurality of dopants has been implanted within one of the single crystal and the epitaxial film, and wherein the implantation of the dopants has generated a plurality of defects and damage within one of the single crystal and the epitaxial film; and exposing one of the single crystal and the epitaxial film to a plurality of annealing cycles. Each of the annealing cycles comprises: annealing one of the single crystal and the epitaxial film at a predetermined temperature for a predetermined time, wherein the annealing removes at least a portion of the plurality of defects and repairs damage to one of the single crystal and the epitaxial film caused by implanting; and cooling the annealed single crystal or epitaxial film and implanted portion at a predetermined cooling rate to a temperature of less than about 100° C.

A third aspect of the invention is to provide a method of implanting a predetermined concentration of at least one dopant in a wide band gap compound. The method comprises the steps of: providing one of a single crystal and an epitaxial film of the wide band gap compound; providing at least one dopant; and implanting the predetermined concentration of the at least one dopant in one of the single crystal and the epitaxial film of the wide band gap compound by a plurality of implantation cycles. The number of implantation cycles is sufficient to implant the predetermined concentration of the at least one dopant in one of the single crystal and the epitaxial film of the wide band gap compound. Each of the implantation cycles comprises the steps of: implanting a portion of the predetermined concentration of the at least one dopant in one of the single crystal and the epitaxial film; and annealing one of the single crystal and the epitaxial film and implanted portion at a predetermined temperature for less than about 60 seconds, wherein the annealing repairs damage to one of the single crystal and the epitaxial film caused by implanting and activates the implanted dopant; and cooling the annealed single crystal or epitaxial film and implanted portion at a predetermined cooling rate to a temperature of less than about 100° C.

These and other aspects, advantages, and salient features of the present invention will become apparent from the following detailed description, the accompanying drawings, and the appended claims.

BRIEF DESCRIPTION OF THE DRAWINGS

FIG. 2 is a flow chart illustrating a method of repairing damage to a wide band gap material due to implantation of dopants;

DETAILED DESCRIPTION

Figure 1:
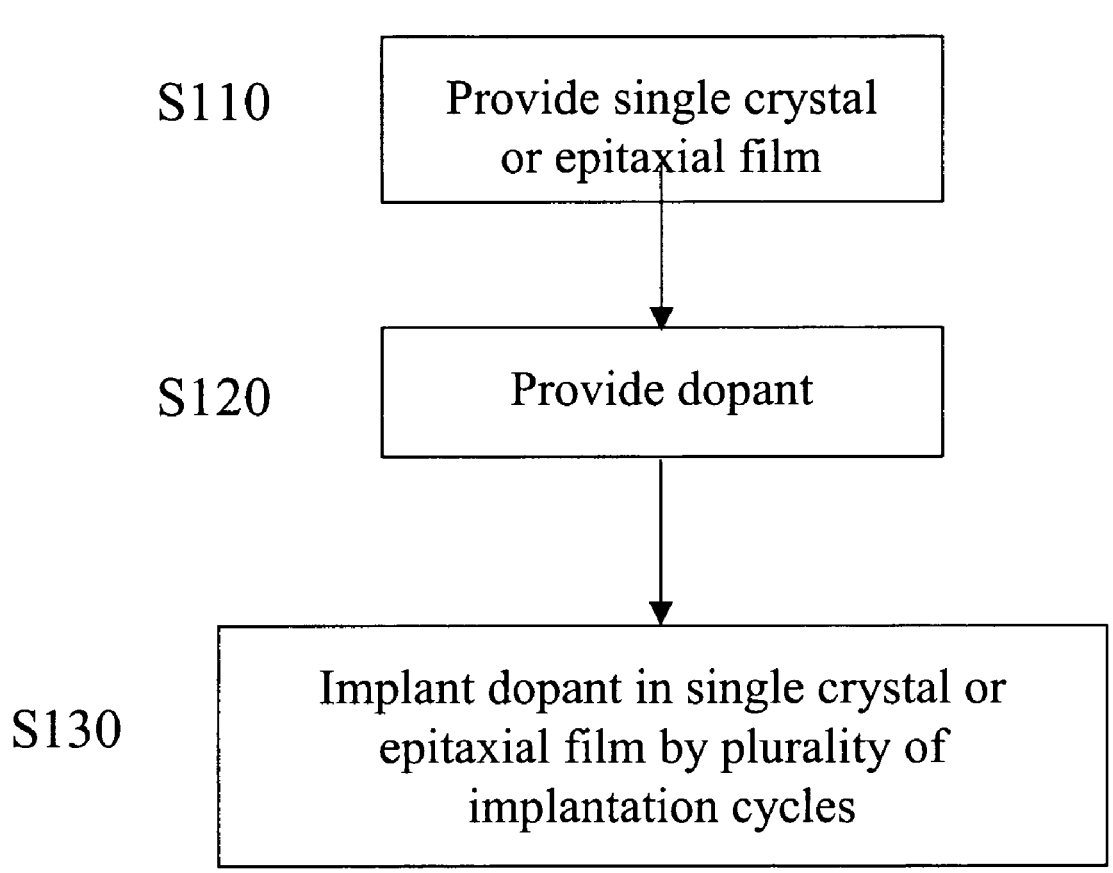
FIG. 1 is a flow chart illustrating a method of implanting dopants in a wide band gap material.

In the following description, like reference characters designate like or corresponding parts throughout the several views shown in the figures. It is also understood that terms such as "top," "bottom," "outward," "inward," and the like are words of convenience and are not to be construed as limiting terms. In addition, whenever a group is described as either comprising or consisting of at least one of a group of elements and combinations thereof, it is understood that the group may comprise or consist of any number of those elements recited, either individually or in combination with each other.

The present invention combines alternate low/medium ion dose implantation (LMDI) with rapid thermal annealing (RTA) at relatively low temperatures. When combined, LMDI and RTA produce high concentrations of dopants while minimizing the defect concentration in wide band gap materials, such as III-V compounds, II-VI compounds, silicon carbide, and the like, in which decomposition occurs in temperature ranges where radiation damage recovery takes place. A significant portion of radiation damage in gallium nitride (GaN) produced by low ion dose implantation, for example, can be readily removed by rapid thermal annealing at temperatures of up to about 1100° C., and the dependence of GaN lattice recovery upon annealing time shows that most of the radiation damage is removed during the initial stage of annealing. At such fast and relatively low temperature annealing conditions, GaN decomposition is negligible and therefore no cap layer or nitrogen overpressure is required.

Referring to the drawings in general and to FIG. 1 in particular, it will be understood that the illustrations are for the purpose of describing a particular embodiment of the invention and are not intended to limit the invention thereto. Turning to FIG. 1, a flow chart illustrating a method 100 of implanting a high concentration of at least one dopant in a wide band gap material is shown. In step S110, a single crystal or epitaxial film of the wide band gap material is provided, and at least one dopant is provided in step S120. For the purposes of describing the invention, a "dopant" is understood to be any element other than the major constituents of the wide band gap compound, and include dopants that affect the physical properties of the wide band gap compound. In step S120, a predetermined concentration of the at least one dopant is incrementally implanted in the single crystal or epitaxial film. The incremental implantation is carried out in a plurality of implantation cycles. A flow chart of an individual implantation cycle 200 is shown in FIG. 2. Each implantation cycle 200 includes an implantation step S210, in which a portion of the predetermined concentration of the at least one dopant is implanted in the single crystal or epitaxial film; an annealing step S220, in which the single crystal or epitaxial film and implanted dopant is annealed at a predetermined temperature and predetermined time; and a cooling step S230, in which the annealed single crystal or epitaxial film and implanted dopant is cooled at a predetermined rate to a temperature of less than about 100° C.

Annealing step S220 repairs the damage caused by the implantation process and also activates the implanted dopants. A dopant changes physical properties—such as conductivity type, optical properties, and the like—of a solid only when it is substituted for one of the original elements of the solid in a lattice position. For instance, an Mg atom on a Ga lattice site produces an acceptor level, whereas a Si atom occupying a Ga lattice site produces a donor level in GaN. After implantation, most of the implanted atoms do not occupy lattice sites and are located on interstitial positions. Annealing not only repairs damage to the lattice but also drives implanted atoms into lattice positions. A dopant occupying a lattice site is referred to herein as an "activated dopant" and the process of moving a dopant from an interstitial position onto a substitutional position is referred to herein as "activation." Damage recovery and dopant activation occurs simultaneously during annealing step S220. The plurality of implantation cycles 200 are repeated until the predetermined concentration of the at least one dopant in the single crystal or epitaxial film is obtained.

The total concentration of dopants that are implanted in implantation step S210 is in a range from about $1\times10^{13}$ cm$^{-2}$ to about $1\times10^{17}$ cm$^{-2}$. A portion ranging from between about 10% and about 50% of the predetermined total concentration is implanted in each cycle 200. The amount of the at least one dopant implanted in each cycle 200 is sufficient to maintain a constant defect concentration within the single crystal or epitaxial film that is below a predetermined defect concentration. That is, the defect concentration after implanting a portion of the dopants is substantially equal to the initial defect concentration (i.e., the defect concentration prior to implantation) within the single crystal or epitaxial film. In one embodiment, "substantially equal" is understood to mean that the increase in defect concentration after implantation is less than about 10% of the initial defect concentration.

Figure 4:
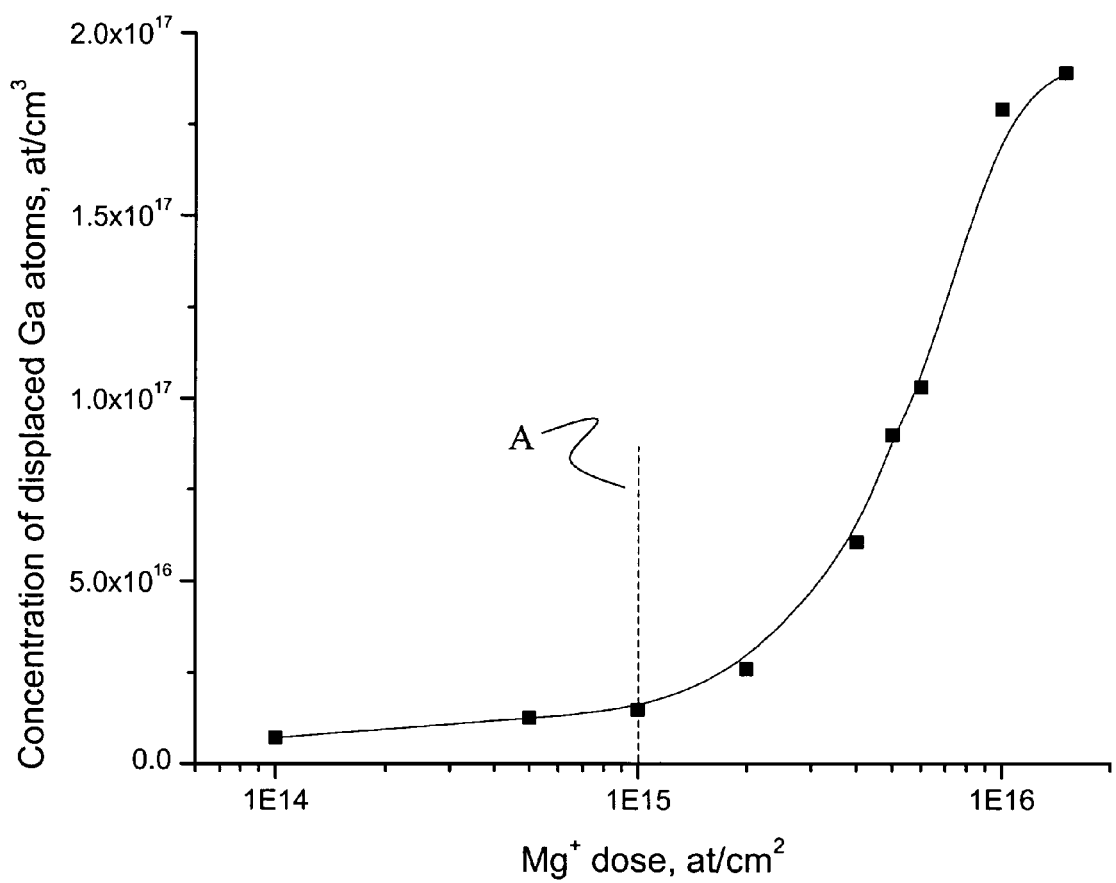
FIG. 4 is a plot of the dependence of concentration of displaced Ga atoms upon ion dose for $Mg^+$ ions implanted in GaN.

The dependence of the concentration of displaced Ga atoms upon Mg$^+$ ion dose, implanted in GaN at an energy of 50 keV, is shown if FIG. 4. The concentration of defects—here, the concentration of displaced Ga atoms—is substantially constant up to about an Mg$^+$ dose of about $10^{15}$ atoms/cm$^2$, denoted by line "A" in FIG. 4. As the Mg$^+$ dose increases beyond this value, the defect concentration increases sharply. While the actual point at which the sharp increase occurs depends upon various parameters, such as the ion being implanted, ion energy, and the material into which the ions are being implanted, similar behavior is observed in most instances. The dose of dopant delivered in implantation step S210 is less than the dose at which such a sharp increase occurs. In one embodiment, ions of the at least one dopant are implanted in the wide band gap material in step S210 by ion implantation.

Figure 3:
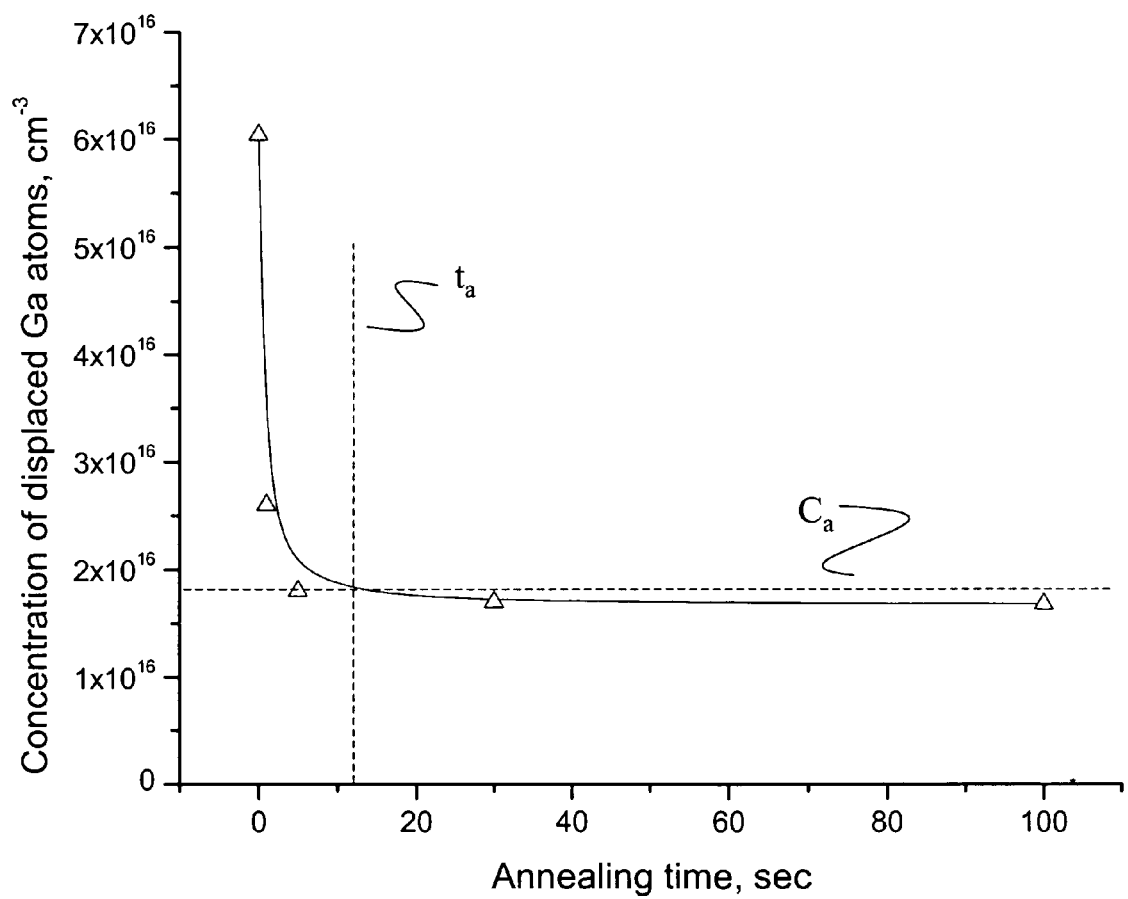
FIG. 3 is a plot of the dependence of defect concentration of displaced gallium (Ga) atoms upon annealing time.

In step S220, the single crystal or epitaxial film and implanted dopants are annealed at a predetermined temperature (also referred to herein as "the annealing temperature") of up to about 1100° C. for a predetermined time. In one embodiment, the annealing temperature is in a range from about 700° C. to about 1100° C. The annealing time is generally less than about 60 seconds. Laser heating, resistive heating, or electron beam heating is used in annealing step S210 to anneal the single crystal or epitaxial film or epitaxial film The annealing time is selected to maintain the defect concentration within the single crystal or epitaxial film at a predetermined level. For example, the annealing time is selected to maintain the defect concentration at substantially the same level as the initial defect concentration within the single crystal or epitaxial film. The dependence of defect concentration upon annealing time is shown in FIG. 3, which shows the dependence of displaced Ga atom concentration on annealing time for Mg$^+$ ions implanted in GaN at an energy of 50 keV to a dose of $4\times10^{15}$ at/cm$^2$ and annealed in vacuum at 1000° C. Initially, the defect concentration decreases sharply with increasing annealing time, and eventually levels off beyond time $t_a$. To achieve defect concentration $C_a$, a single crystal or epitaxial film in which dopants have been implanted should be annealed for time $t_a$. However, because no significant decrease is observed beyond $t_a$, longer annealing times are not necessary. Thus, annealing time in step S220 is generally carried out for a time that is at least as great as time $t_a$. However, the annealing time need not be extended to a time that is significantly greater (e.g., an order of magnitude greater) than $t_a$. In one embodiment, for example, annealing step S220 is carried out for about 60 seconds. The actual value of $t_a$ depends upon a number of parameters such as, but not limited to, the ion being implanted, ion energy, the material into which the ions are being implanted, and the actual anneal temperature.

In one embodiment, annealing step S220 is carried out under vacuum. In another embodiment, annealing step S220 is carried out at a pressure in a range from about $10_{-3}$ Torr to about $10^{-5}$ Torr. Alternatively, annealing step S220 is carried out under a controlled atmosphere to prevent thermal decomposition of the wide band gap material. For example, gallium nitride may be annealed under an ambient pressure of nitrogen gas.

Following annealing step S230, the single crystal or epitaxial film with the implanted portion of dopants is cooled at a predetermined rate to a temperature of less than about 100° C. The predetermined cooling rate is in a range from about 0.1° C./sec to about 10° C./sec.

With each cycle 200, a portion of the desired concentration of the at least one dopant is implanted in the single crystal or epitaxial film and the resulting damage is repaired by annealing step S220. Cycle 200 is repeated until the predetermined concentration of the at least one dopant within the single crystal or epitaxial film is obtained.

In one embodiment, the single crystal or epitaxial film is placed on a sample holder that serves as platform for implantation step S210 and is capable of being heated and cooled in situ in the ion implanter without transferring the sample to an external furnace. Following implantation, the single crystal or epitaxial film is first annealed by heating the stage, and then cooled to below 100° C. by then cooling the stage.

The wide band gap material is a material selected from the group consisting of III-V compounds, II-VI compounds, silicon carbide, and combinations thereof, where Roman numerals II, III, V, and VI refer to the element groups in the periodic table of the elements. In one embodiment, the III-V compound is a group III nitride and, in a preferred embodiment, the group III nitride is gallium nitride (GaN). In another embodiment, the wide band gap material is a group II oxide such as, but not limited to, zinc oxide.

The at least one dopant may comprise at least one p-type dopant, such as, but not limited to, alkali earth metals. In one embodiment, the at least one p-dopant includes at least one of magnesium and beryllium. Alternatively, the dopant may comprise an n-type dopant, such as silicon or an optically active dopant, such as a rare earth element. Non-limiting examples of such optically active rare earth elements include erbium, europium, praseodymium, and thulium.

Another aspect of the invention is to provide a method of repairing damage to a single crystal or epitaxial film of a wide band gap material due to implantation of dopants within the single crystal or epitaxial film. Here, a single crystal or epitaxial film in which dopants have been implanted is exposed to a plurality of annealing cycles. Each of the annealing cycles comprises a step in which the single crystal or epitaxial film is first annealed at a predetermined temperature for a predetermined time to repair damage to the single crystal or epitaxial film caused by implanting the dopants and to activate the dopants. The annealed single crystal or epitaxial film is then cooled at a predetermined rate to a temperature of less than about 100° C. Details of annealing step S210 and cooling step S230 are provided hereinabove.

The following example illustrates the features and advantages of the present invention, and is not intended to limit the invention thereto.

EXAMPLE 1

The effectiveness of LMDI RTA technique described herein was investigated for lattice recovery of GaN implanted with $Mg^+$ ions. Two 1 μm GaN single crystal films were implanted at room temperature with 50 keV $Mg^+$ ions. Sample 1 was implanted in a single step to obtain a dose of $6 \times 10^{15} cm^{-2}$ of $Mg^+$ ions and then annealed three times at 900° C. for 30 seconds. Sample 2 was implanted in three steps to obtain the same total ion dose ($6 \times 10^{15} cm^{-2}$). The ion dose for each step was $2 \times 10^{15} cm^{-2}$. Each implantation step was followed by a single annealing step at 900° C. for 30 sec. Thus, both Sample 1 and Sample 2 were implanted to the same total $Mg^+$ ion dose ($6 \times 10^{15} cm^{-2}$) and annealed three times under the same conditions.

Figure 5:
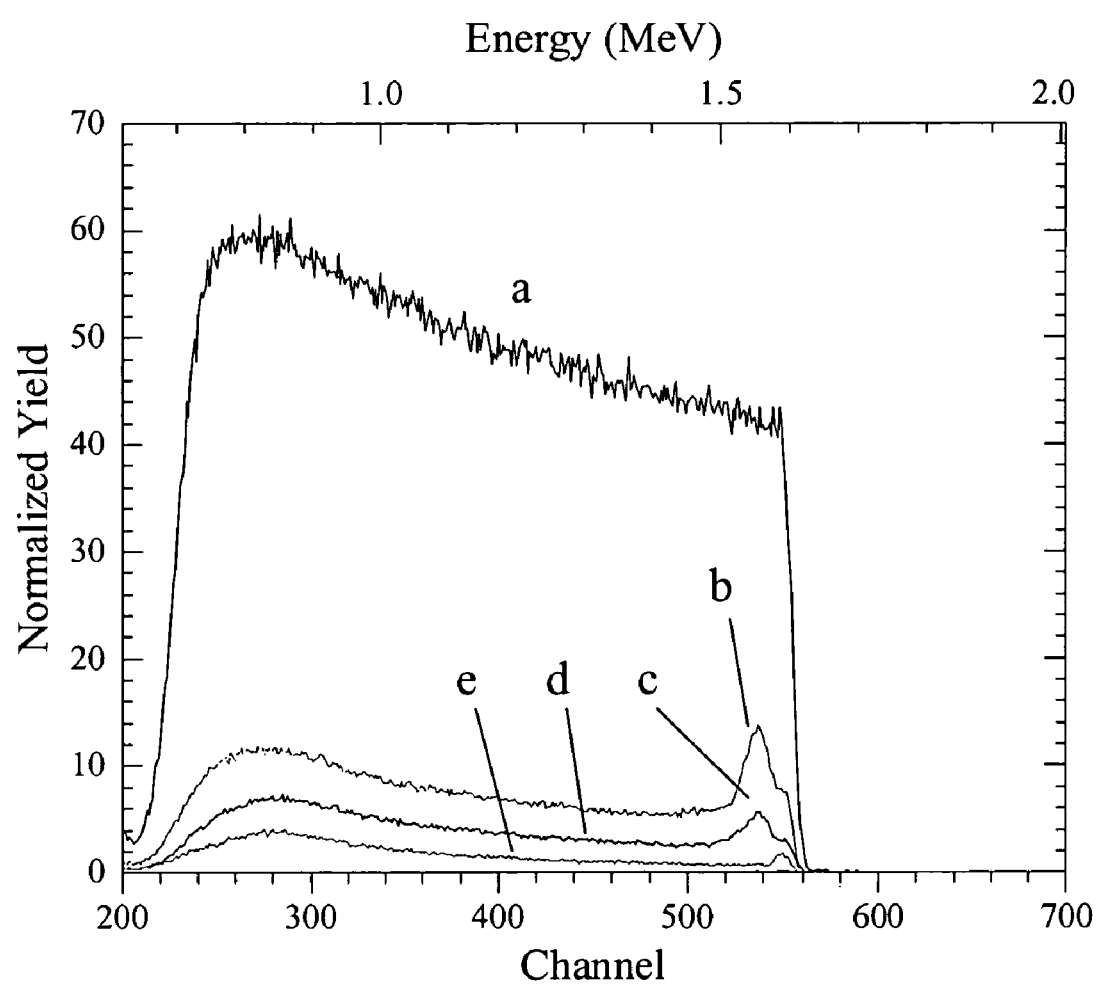
FIG. 5 is a plot of Rutherford backscattering spectroscopy (RBS) spectra showing: a) a random (unaligned) RBS spectrum of a 1 μm GaN single crystal film; b) an aligned spectrum of a 1 μm GaN single crystal film implanted in a single step with a 50 keV $Mg^+$ ion dose of $6 \times 10^{15} cm^{-2}$; c) an aligned spectrum obtained for a sample implanted with 50 keV $Mg^+$ ions in a single step and then annealed three times at 900° C. for 30 seconds; d) an aligned spectrum obtained for a sample implanted with 50 keV $Mg^+$ ions in three steps to obtain the same total ion dose as in (b) and annealed after each implantation step at 900° C. for 30 seconds; and e) an aligned spectrum of a GaN sample in which no dopants were implanted.

The amount of lattice damage to each sample was measured by Rutherford backscattering spectroscopy combined with channeling (RBS/C) and is shown in FIG. 5. In FIG. 5: (a) is a random unaligned RBS spectrum; (b) is a spectrum of a 1 μm GaN single crystal film implanted in a single step with a $Mg^+$ ion dose of $6 \times 10^{15} cm^{-2}$ and having an implantation energy of 50 keV; (c) is an aligned spectrum obtained for Sample 1, which was implanted with 50 keV $Mg^+$ ions in a single step and then annealed three times at 900° C. for 30 sec; (d) is an aligned spectrum obtained for Sample 2, which was implanted with 50 keV $Mg^+$ ions in three steps to obtain the same total ion dose as Sample 1, and annealed after each implantation step at 900° C. for 30 sec; and (e) an aligned spectrum of a GaN sample in which no dopants were implanted. Although complete lattice recovery was not achieved in either Sample 1 or Sample 2, the amount of lattice damage in the peak maximum was equal to 16.0% and 10.9% for these two samples, respectively. Thus, the amount of damage in Sample 2, which was subjected to the multiple LMDI RTA technique described herein, was approximately 1.5 times less than that observed in Sample 1. Better lattice recovery is caused not only by smaller initial amounts of damage, but also by destroying the large stable defects such as defect clusters, dislocations, and the like, formed during annealing.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A method of implanting a predetermined concentration of at least one impurity in a wide band gap compound, comprising:
    a) providing a single crystal of the wide band gap compound;
    b) providing at least one impurity;
    c) implanting the predetermined concentration of the at least one impurity in the single crystal of the wide band gap compound by a plurality of implantation cycles, wherein a number of implantation cycles is sufficient to implant the predetermined concentration of the at least one impurity in the single crystal of the wide band gap compound, and wherein each of the implantation cycles comprises:
        i) implanting a portion of the predetermined concentration of the at least one impurity in the single crystal; and
        ii) annealing the single crystal and implanted portion at a predetermined temperature for a predetermined time, wherein annealing repairs damage to the single crystal caused by implanting and activates the implanted impurity; and
        iii) cooling the annealed single crystal and implanted portion at a predetermined cooling rate to a temperature of less than about 100° C.

2. The method according to claim 1, wherein the predetermined time for annealing is less than about 60 seconds.

3. The method according to claim 1, wherein the wide band gap compound is a compound selected from the group consisting of III-V compounds, II-VI compounds, silicon carbide, and combinations thereof.

4. The method according to claim 3, wherein the wide band gap compound is a group III nitride.

5. The method according to claim 4, wherein the group III nitride is gallium nitride.

6. The method according to claim 3, wherein the wide band gap compound is a group II oxide.

7. The method according to claim 6, wherein the group II oxide is zinc oxide.

8. The method according to claim 1, wherein the at least one dopant comprises at least one p-type dopant.

9. The method according to claim 8, wherein the at least one p-type dopant comprises at least one alkali earth metal.

10. The method according to claim 9, wherein the at least one alkali earth metal comprises at least one of magnesium and beryllium.

11. The method according to claim 1, wherein the at least one dopant comprises at least one n-type dopant.

12. The method according to claim 11, wherein the at least one n-type dopant comprises an ion of one of silicon and a rare earth element.

13. The method according to claim 12, wherein the rare earth element is one of erbium, europium, praseodymium, and thulium.

14. The method according to claim 1, wherein the step of implanting a portion of the predetermined concentration of the at least one dopant in one of the single crystal and the epitaxial film comprises implanting the portion by ion implantation.

15. The method according to claim 1, wherein the predetermined concentration is in a range from about $1 \times 10^{13}$ $cm^{-2}$ to about $1 \times 10^{17}$ $cm^{-2}$.

16. The method according to claim 15, wherein the portion implanted in each cycle is between about 10% and about 50% of the predetermined concentration.

17. The method according to claim 1, wherein one of the single crystal and the epitaxial film has an initial defect concentration prior to implantation, and wherein the portion implanted in each cycle is sufficient to maintain a defect concentration within one of the single crystal and the epitaxial film substantially equal to the initial defect concentration.

18. The method according to claim 1, wherein the step of annealing one of the single crystal and the epitaxial film and implanted portion at a predetermined temperature for a predetermined time comprises annealing one of the single crystal and the epitaxial film and implanted portion at a temperature of up to about 1100° C. for a predetermined time.

19. The method according to claim 18, wherein the predetermined temperature is in a range from about 700° C. to about 1100° C.

20. The method according to claim 1, wherein the step of annealing one of the single crystal and the epitaxial film and implanted portion at a predetermined temperature for a predetermined time comprises annealing one of the single crystal and the epitaxial film and implanted portion at the predetermined temperature for a time sufficient to maintain a defect concentration within one of the single crystal and the epitaxial film below a predetermined defect concentration.

21. The method according to claim 1, wherein the predetermined temperature is a temperature sufficient to maintain a defect concentration within one of the single crystal and the epitaxial film below a predetermined defect concentration.

22. The method according to claim 1, wherein the step of annealing one of the single crystal and the epitaxial film and implanted portion at a predetermined temperature for a predetermined time comprises vacuum annealing one of the single crystal and the epitaxial film and implanted portion at a predetermined temperature for a predetermined time.

23. The method according to claim 1, wherein the step of annealing one of the single crystal and the epitaxial film and implanted portion at a predetermined temperature for a predetermined time comprises annealing one of the single crystal and the epitaxial film and implanted portion at a predetermined temperature for a predetermined time in a controlled atmosphere.

24. The method according to claim 23, wherein the controlled atmosphere is a nitrogen atmosphere at ambient pressure.

25. The method according to claim 1, wherein the step of annealing one of the single crystal and the epitaxial film and implanted portion at a predetermined temperature for a predetermined time comprises heating one of the single crystal or epitaxial film by one of laser heating, resistive heating, and electron beam heating.

26. A method of repairing damage to a one of a single crystal and an epitaxial film of a wide band gap material due to implantation of dopants within one of the single crystal and the epitaxial film, comprising:
a) providing one of the single crystal and the epitaxial film, wherein a plurality of dopants has been implanted within one of the single crystal and the epitaxial film, and wherein the implantation of the dopants has generated a plurality of defects and damage within one of the single crystal and the epitaxial film; and
b) exposing one of the single crystal and the epitaxial film to a plurality of annealing cycles, wherein each of the annealing cycles comprises:
i) annealing one of the single crystal and the epitaxial film at a predetermined temperature for a predetermined time, wherein the annealing removes at least a portion of the plurality of defects and repairs damage to one of the single crystal and the epitaxial film caused by implanting; and
ii) cooling the annealed single crystal and implanted portion at a predetermined cooling rate to a temperature of less than about 100° C.

27. The method according to claim 26, wherein the step of annealing one of the single crystal and the epitaxial film and implanted portion at a predetermined temperature for a predetermined time comprises annealing one of the single crystal and the epitaxial film and implanted portion up to about 1100° C. for a predetermined time.

28. The method according to claim 26, wherein the predetermined temperature is in a range from about 700° C. to about 1100° C.

29. The method according to claim 26, wherein the step of annealing one of the single crystal and the epitaxial film and implanted portion at a predetermined temperature for a predetermined time comprises annealing one of the single crystal and the epitaxial film and implanted portion at the predetermined temperature for a time sufficient to maintain a defect concentration within one of the single crystal and the epitaxial film below a predetermined defect concentration.

30. The method according to claim 26, wherein the predetermined temperature is a temperature sufficient to maintain a defect concentration within one of the single crystal and the epitaxial film below a predetermined defect concentration.

31. The method according to claim 26, wherein the step of annealing one of the single crystal and the epitaxial film and implanted portion at a predetermined temperature for a predetermined time comprises vacuum annealing one of the single crystal and the epitaxial film and implanted portion at a predetermined temperature for a predetermined time.

32. The method according to claim 26, wherein the step of annealing one of the single crystal and the epitaxial film and implanted portion at a predetermined temperature for a predetermined time comprises annealing one of the single crystal and the epitaxial film and implanted portion at a predetermined temperature for a predetermined time in a controlled atmosphere.

33. The method according to claim 32, wherein the controlled atmosphere is a nitrogen atmosphere at ambient pressure.

34. The method according to claim 26, wherein the step of annealing one of the single crystal and the epitaxial film and implanted portion at a predetermined temperature for a predetermined time comprises heating one of the single crystal or epitaxial film by one of laser heating, resistive heating, and electron beam heating.

35. A method of implanting a predetermined concentration of at least one dopant in a wide band gap compound, comprising:
a) providing one of a single crystal and an epitaxial film of the wide band gap compound;
b) providing at least one dopant;
c) implanting the predetermined concentration of the at least one dopant in one of the single crystal and the epitaxial film of the wide band gap compound by a plurality of implantation cycles, wherein a number of implantation cycles is sufficient to implant the predetermined concentration of the at least one dopant in one of the single crystal and the epitaxial film of the wide band gap compound, and wherein each of the implantation cycles comprises:
i) implanting a portion of the predetermined concentration of the at least one dopant in one of the single crystal and the epitaxial film; and
ii) annealing one of the single crystal and the epitaxial film and implanted portion at a predetermined temperature for less than about 60 seconds, wherein the annealing repairs damage to one of the single crystal and the epitaxial film caused by implanting and activates the implanted dopant; and
iii) cooling the annealed single crystal and implanted portion at a predetermined cooling rate to a temperature of less than about 100° C.

* * * * *